United States Patent

Chun et al.

[11] Patent Number: 6,133,727
[45] Date of Patent: Oct. 17, 2000

[54] METHOD FOR VERIFYING SEMICONDUCTOR DEVICE TESTER

[75] Inventors: Byoung Ok Chun; Byung Rae Cho; Sang Hon Lee; Yun Soon Park, all of Chungcheongnam-do, Rep. of Korea

[73] Assignee: Samsung Electronics Co., Ltd., Rep. of Korea

[21] Appl. No.: 09/225,614

[22] Filed: Jan. 5, 1999

[30] Foreign Application Priority Data

Jan. 15, 1998 [KR] Rep. of Korea .................. 98-1070

[51] Int. Cl.[7] ........................................ G01R 31/28
[52] U.S. Cl. ................. 324/158.1; 324/754; 714/745; 702/116; 702/123
[58] Field of Search ................... 324/158.1, 754, 324/765; 714/745, 721; 365/201; 702/57, 58, 116–123; 235/375

[56] References Cited

U.S. PATENT DOCUMENTS

| | | | |
|---|---|---|---|
| 5,469,394 | 11/1995 | Kumakura et al. | 365/201 |
| 5,654,632 | 8/1997 | Ohno | 324/158.1 |
| 5,940,413 | 8/1999 | Kim et al. | 365/201 |

*Primary Examiner*—Safet Metjahic
*Assistant Examiner*—Jimmy Nguyen
*Attorney, Agent, or Firm*—Skjerven Morrill MacPherson LLP; Don C. Lawrence

[57] ABSTRACT

A method for verifying correct operation and functional stability of a tester for semiconductor devices is disclosed. In addition, a method for creating a standard device for use with the tester is also disclosed. In creating a standard device according to the present invention, the tester repeatedly tests a candidate device a predefined number of times and evaluates the test results to determine whether the candidate device is suitable for use as a standard device. In verifying the operation and functional stability of a semiconductor device tester, data generated by repeatedly testing a standard device a predefined number of times are compared to recorded reference data of previous tests of the standard device.

16 Claims, 2 Drawing Sheets

METHOD FOR VERIFYING SEMICONDUCTOR DEVICE TESTER

BACKGROUND

1. Field of the Invention

The present invention relates to a method of verifying correct operation of a tester for semiconductor devices, and to a method for creating a test standard device for use with such a tester.

2. Description of the Related Art

After manufacture and prior to shipment, semiconductor devices are typically subjected to a number of tests to verify their performance and reliability. Among these is an electrical performance test.

The testing apparatus conducts electrical performance tests by measuring certain electrical characteristics of the semiconductor devices and sorts them into a number of "bin" categories according to the test results. For example, the semiconductor devices classified as "BIN1" (i.e., bin category 1) are those that pass, or fall within, the electrical performance specification, in respect to all test items, and devices classified as BIN7 (i.e., bin category 7) are those that fail, or are outside of specification, in respect to all test items. BIN2 through BIN6 are reserved for the devices that are within specification in respect to certain test items and out of specification with respect to others. Of course, the bin numbering system used may be different than that described above, depending on the particular manufacturer and devices being tested. However, it is common within the industry that BIN1 represents devices that fall within specification on all test items.

For assuring the fidelity of semiconductor device tests, it is necessary to verify that the apparatus used to test the devices, i.e., the tester itself, is functioning correctly. In a conventional test method, when the tester sorts a "standard device," i.e., one that has previously been determined to be within specification on all test items, into BIN1, the tester is deemed to be functioning properly. On the other hand, if the tester does not sort the standard device into BIN1, the tester is suspected to be malfunctioning. That is, if the tester sorts the standard device into any BIN, e.g., BINX, other than BIN1, it is presumed that the tester is malfunctioning, at least with respect to the particular test item(s) related to BINX.

Also, in accordance with the conventional method, the test engineer initially selects a test standard device from a group of candidate devices. The engineer must test each of the candidate devices manually, then select a standard device from the group by means of a laborious statistical analysis of the test results.

In the conventional test method, it is presumed that the tester is malfunctioning, at least with respect to a particular test item, when the number of defective devices sorted by that tester to a specific BIN is higher than the average number of defective devices in that BIN. However, that is not always the case, as it is possible that the tested devices are actually out of specification in regard to the specific test item. In addition, when replacement of a standard device is necessary, the test engineer must manually select the standard device by application of his/her subjective judgment to voluminous test results, as described above, and thus, the creation of a precise test standard device can be a very cumbersome and laborious task.

SUMMARY OF THE INVENTION

The present invention provides a method of verifying the correct operation and functional stability of a tester for semiconductor devices by comparing the measured electrical characteristics of a standard device with reference electrical characteristics data for that device. The invention also provides a method of creating a standard device by automatically checking whether a candidate device shows suitable electrical characteristics for use as a standard device.

More specifically, a semiconductor device tester according to the present invention has a check-tester mode for verifying the correct operation of the tester, and a standard-device-creation mode for creating a new standard device for use with the tester when a new standard device is necessary. In operation, the test engineer selects between the check-tester mode and the standard-device-creation mode.

In the standard-device-creation-mode, the tester reads the type number and serial number of a candidate standard device and determines whether a standard device with the identical serial number is available. If a standard device with the identical serial number is available, the tester determines whether or not to replace the standard device with the candidate device. If a standard device with the identical serial number is not available, or if a decision has already been made to replace the standard device, the tester repeatedly tests the candidate device a predefined number of times. The tester then computes the mean values and standard deviations of the test results for every test item, determines whether the calculated data is within a required distribution range established for the particular device, and decides whether the tested device is suitable for use as a standard device.

In the check-tester mode, the tester reads a type number and serial number of a standard device provided by the operating engineer, fetches from memory previously determined and stored reference data characteristic to the particular standard device, repeatedly tests the standard device a predefined number of times, and calculates the mean test values on every test item. The tester then compares the calculated data with the fetched reference data and, if the calculated data is out of an allowable range, performs an inspection of itself. The inspection of the tester includes reading the test results and re-calibrating itself. If, after calibration of the tester, a re-test of the standard device still results in an unacceptable range of data, then the tester is deemed to be malfunctioning, and a individual test of each test item is performed, one by one, to determine the particular test item(s) with respect to which the tester is malfunctioning.

DETAILED DESCRIPTION OF THE PREFERRED EMBODIMENTS

The present invention will be described with reference to FIGS. 1 and 2. In accordance with the invention, a tester for semiconductor devices has two operational modes: A "check-tester" mode for checking the correct operation of the tester by comparing the test results from testing a standard device with stored reference data for the standard device; and, a "create-standard-device" mode for creating a new standard device when a new standard device is needed for the tester.

Figure 1:
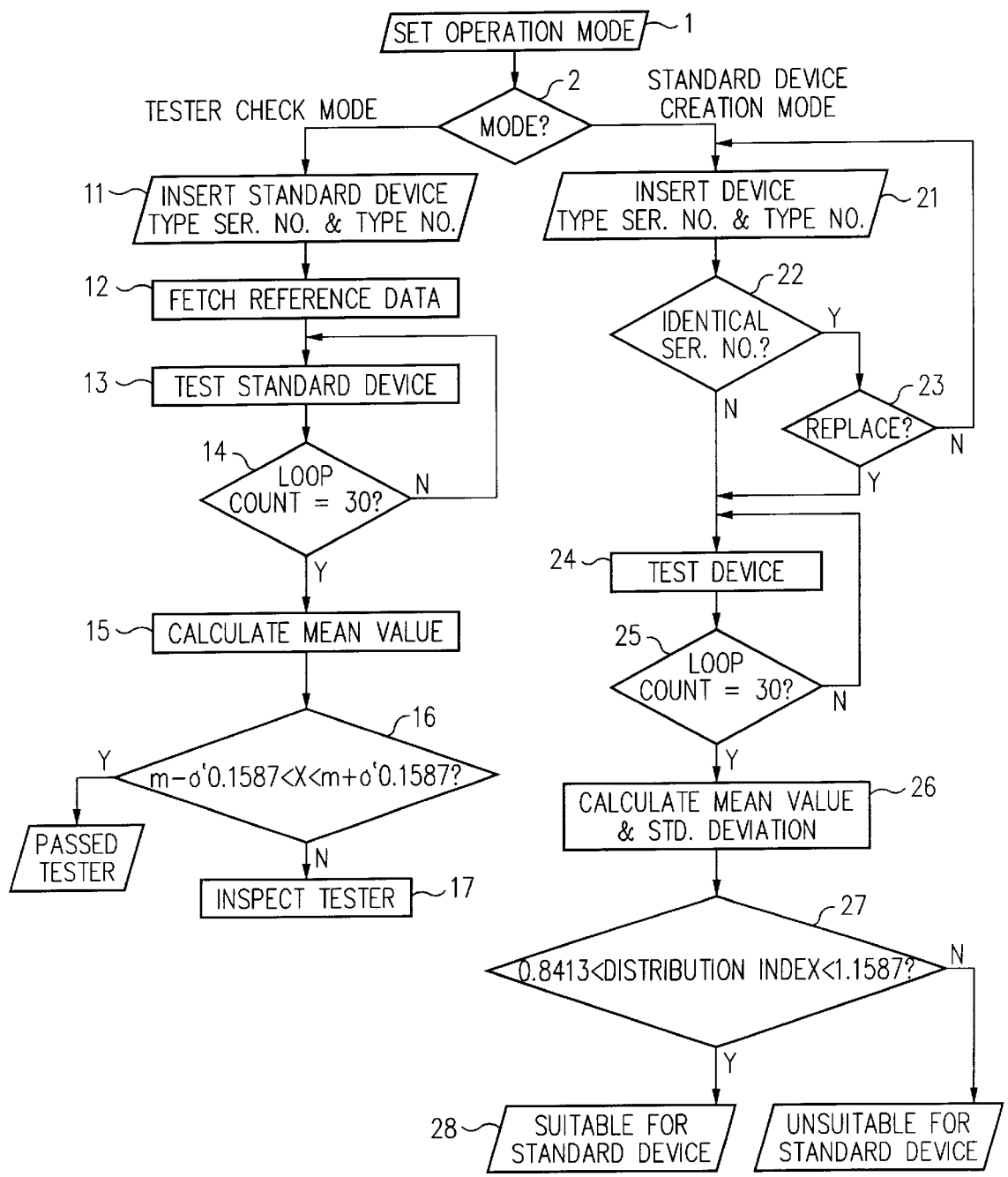
FIG. 1 is a flowchart showing a method for creating a test standard device, and for verifying correct operation of a tester in accordance with the present invention; and, FIG. 2 is a detailed flowchart showing the method for inspecting the tester in FIG. 1.

Referring to FIG. 1, in operating the tester, the test engineer chooses between the check-tester mode and the create-standard-device mode (step 1), inserts a device into the tester, along with the type and serial number of the device, and the tester reads and responds to the mode selected (step 2). If the tester reads the create-standard-device mode, the tester reads the type number and serial number of a device to be used as a standard device (step 21) and checks whether a previously tested and registered standard device with an identical serial number already exists (step 22). If a standard device with the identical serial number exists, the tester determines whether or not to replace the standard device (step 23). If a standard device with the identical serial number does not exist, or is otherwise not available, or if it has been decided to replace the standard device, the tester repeatedly tests the candidate device a predefined number of times (steps 24 and 25). The tester then calculates the mean values and standard deviations of the test values of every test item (step 26), checks whether the calculated data is within a required distribution range (step 27), and then decides whether the tested device is suitable for use as a new standard device (step 28).

If the tester reads the check-tester mode (step 2), the tester reads the type number and serial number of the standard device which was inserted by the engineer (step 11), fetches reference data ($D_{ref}$), comprising previously measured and stored electrical data characteristic of the specific standard device (step 12), repeatedly tests the standard device a predefined number of times (step 13), and calculates the mean of the test values of every test item (step 15). The tester then compares the calculated data with the fetched reference data ($D_{ref}$) (step 16) and, if the calculated data is out of an allowable range, performs an inspection upon itself (step 17).

Figure 2:
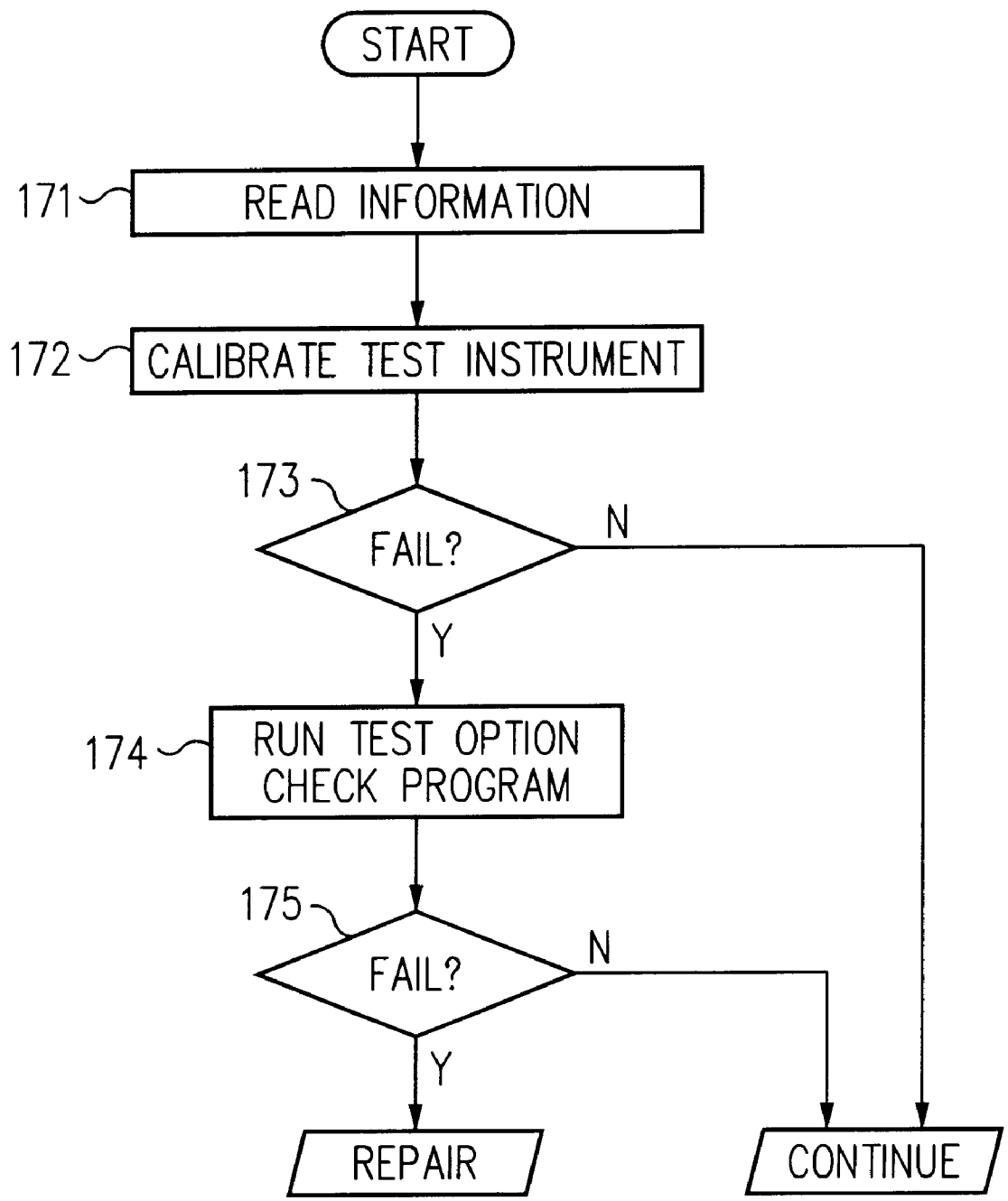

FIG. 2 is a flowchart describing in detail the self-inspection (step 17) performed by the tester. The tester reads the test results (step 171) and re-calibrates itself (step 172) in accordance with the difference between the test results and the reference data. After re-calibration, a re-test of the standard device is performed, and if the re-test of the standard device still results in test data outside of the specified range, the tester re-runs each test item on a one-by-one basis until the particular test item(s) with respect to which the tester is malfunctioning have been ascertained (step 174), and displayed to the test engineer, e.g., in a print-out, or recorded for later review (step 175).

Following is a more detailed description of the operation of the tester according to the method of the present invention. First, the test engineer selects, as a desired operating mode, between a create-standard-device mode, which determines whether a candidate device can be used a standard device, and a check-tester mode, which checks that the tester is operating correctly (step 1). Computer test programs for controlling the operation of the tester can be written and stored in a library, and the library of programs can be implemented in the tester in, e.g., the UNIX/C language.

The create-standard-device mode is discussed first. When the currently-used standard device needs to be replaced, e.g., because it has been lost, or has gone out of specification by ageing, this mode determines on the basis of reference data ($D_{ref}$) whether a candidate device is suitable as a new standard device. The engineer loads one of the candidate devices into the tester and enters data into the tester corresponding to a serial number and a device type number that the engineer has assigned to the candidate device (step 21). For example, if it has been decided that, among a group of standard devices numbered 1 to 5, device 3 should be replaced, the engineer types in or otherwise enters a serial number 3 into the tester.

If the tester finds standard device data corresponding to the specified serial number stored in its tester program (step 22), the tester determines whether or not to replace this existing standard device (step 23). That is, if the tester decides that the standard device having the specified serial number is still usable as a standard device, the tester returns to the initial state. On the other hand, if the standard device having the specified serial number need to be replaced, or if the tester does not find stored in its program any reference data corresponding to the serial number specified for the standard device, the tester repeatedly tests the candidate device a predefined number of times on every test item specified in the program for that type of device (step 24). Although more repetitions of the test on the candidate device will, in general, guarantee better test accuracy, it has been discovered that, in the present invention, thirty (30) repetitions of the test produce sufficient accuracy (step 25). Depending on the particular type of device involved, however, the number of repetitions of the test can be decreased without necessarily lessening the test accuracy.

If the candidate device fails any single one of the test items for any single one of the 30 repetitions of the test, the candidate is eliminated from consideration as a standard device. If all thirty test results for the candidate are within specification on all test items, the tester collects the test results and calculates the mean values and the standard deviations of every test item (step 26). Table 1 below shows an example of the calculated data.

TABLE 1

| Tester | Head # | Date   | Mean Value | Standard deviation |
|--------|--------|--------|------------|--------------------|
| BAY22  | 11     | 971008 | 12.4702    | 0.08067            |
| BAY22  | 11     | 971009 | 12.3834    | 0.09003            |
| BAY22  | 11     | 971010 | 12.2795    | 0.1241             |
| BAY22  | 11     | 971011 | 12.3321    | 0.07333            |
| BAY22  | 11     | 971012 | 12.2423    | 0.13721            |
| BAY22  | 12     | 971008 | 12.5201    | 0.09957            |
| BAY22  | 12     | 971009 | 12.4400    | 0.08412            |
| BAY22  | 12     | 971010 | 12.2727    | 0.14827            |
| BAY22  | 12     | 971011 | 12.4048    | 0.08304            |
| BAY22  | 12     | 971012 | 12.2701    | 0.15812            |
| BAY22  | 21     | 971008 | 12.3598    | 0.14975            |
| BAY22  | 21     | 971009 | 12.1478    | 0.09648            |
| BAY22  | 21     | 971011 | 12.2648    | 0.1106             |
| BAY22  | 21     | 971012 | 12.2707    | 0.11405            |
| BAY25  | 11     | 971009 | 12.3002    | 0.108136           |
| BAY25  | 11     | 971010 | 12.3886    | 0.0898             |
| BAY22  | 11     | 971008 | 16.15443   | 6.1288845          |
| BAY22  | 11     | 971009 | 16.10167   | 6.0731605          |
| BAY22  | 11     | 971010 | 16.01565   | 5.976351667        |
| BAY22  | 11     | 971011 | 16.09272   | 6.069498833        |
| BAY22  | 11     | 971012 | 15.98394   | 5.940490167        |
| BAY22  | 12     | 971008 | 16.16048   | 6.1289495          |
| BAY22  | 12     | 971009 | 16.13588   | 6.109242           |
| BAY22  | 12     | 971010 | 15.98808   | 5.940490167        |
| BAY22  | 12     | 971011 | 16.11936   | 6.093064           |
| BAY22  | 12     | 971012 | 15.97693   | 6.926858667        |
| BAY22  | 21     | 971008 | 16.03015   | 5.982729167        |
| BAY22  | 21     | 971009 | 15.97742   | 5.946868           |
| BAY22  | 21     | 971011 | 16.0218    | 5.986776667        |
| BAY22  | 21     | 971012 | 16.0213    | 5.985184167        |
| BAY25  | 11     | 971009 | 16.04199   | 6.007755933        |
| BAY25  | 11     | 971010 | 16.1045    | 6.076063333        |

From the calculated data, the tester decides whether the candidate device is suitable for use as a standard device (step 27). In accordance with this invention, the candidate device is regarded as suitable for use as a standard device when the Distribution Index, which is defined as:

$$\text{Distribution Index} = \frac{\text{Mean Value} - \text{Lower Limit}}{\frac{\Delta \lim}{2}}$$

of the test data on every test item is within the range of from 0.8413 to 1.1587, where, Δlim=Upper Limit−Lower Limit, the Upper Limit is the highest allowable value within the specification for the test item, and the Lower Limit is the lowest allowable value within the specification for the test item. The above range represents the distribution index within 1σ (1σ is one standard deviation).

If the candidate device is judged as a standard device, the serial number initially accorded to it is marked on the device for future identification.

Next, the check-tester mode is discussed in more detail. A test engineer selects the check-tester mode on the tester (step 1), then loads a previously registered standard device into the tester and enters the serial number and device type number of the standard device loaded (step 11). The tester reads the type and serial numbers of the standard device loaded then fetches the reference data ($D_{ref}$) corresponding to that standard device (step 12). The reference data comprises electrical characteristics of the standard device which were previously stored in the memory of the tester. The reference data was created and identified when the standard device was created as a standard, as descried above, and includes a mean value (m) and a standard deviation (σ') of each of the electrical characteristics specified as a test item in the test protocol for the particular device.

As shown in FIG. 1, the standard device is tested repeatedly a predefined number of times (steps 13 and 14), and a mean value (X) of the test results on each test item is calculated (step 15). The calculated data is recorded in terms of tester type, device type, test head, date, etc., for verifying correct operation and functional stability of the tester in the future.

The mean value (X) of the test data from the standard device for each test item is then compared to the reference data ($D_{ref}$). For example, in a preferred embodiment of the method, the comparison can be made on the basis of whether X is between (m−0.1587σ') and (m+0.1587σ') (step 16). However, the particular range adopted can be modified, depending on the particular device type and tester involved.

If X is within the required range, the tester is regarded as functioning properly. If X is outside of the range, it means that the tester is not functioning properly, and that an inspection of the tester must be performed (step 17). The tester inspection (step 17) is functionally illustrated in detail in FIG. 2. The tester self-inspection starts by opening files that contain information about both the particular standard device and the tester itself (step 17).

A tester of the type that is under consideration here generally includes a test instrument, e.g., a voltmeter, and a test option. The test instrument is a component of the tester that performs certain tests of a generalized type, e.g., measuring voltage, and the test option is a component of the semiconductor device tester dedicated to testing a specific test item, e.g., the voltage level at a specific location on a particular device. After the information files have been retrieved and compared, the tester re-calibrates the instrument corresponding to the specific test item or items with respect to which it has been deemed to be malfunctioning to correct for any functional shift that may have occurred in the test instrument (step 172). The standard device is then re-tested, and if the mean value of the test item for the standard device is still out of the specified range after the re-calibration (step 173), the tester runs a "test-option check" program on the test items for all BINs (step 174). If the tester fails the test-option check, it is defective and must be repaired.

Those skilled in the art will appreciate that, when the devices go repeatedly to the same specific BIN, test option checking can be performed independently of the test instrument check, i.e., without having to re-calibrate the test instrument. That is, by monitoring whether an identical failure continues to occur, it is possible to focus exclusively upon the test option that is giving rise to the failed test item. In this case, the BIN to which the standard device is relegated after the test-option check is performed is compared with the BIN to which the standard device was relegated before the test option checking, to verify that they are the same and that the test option checking was thus performed correctly. Thereafter, the test option used for the relevant BIN may be performed at selected intervals as a running check on the functional stability of the tester.

From the foregoing, it may be seen that the present invention provides an easy, efficient method for analyzing and monitoring the correct operation and functional stability of a tester for semiconductor devices, as well as a simple, accurate method for creating a standard device which can be used as a reference device in analyzing the operation and stability of the tester.

While this invention has been described with reference to an illustrative embodiment, this description is not intended to be construed in a limiting sense, and those skilled in the art will appreciate that various modifications and alterations can be made to it without departing from its spirit and scope.

What is claimed is:

1. A method for analyzing the functional stability of a semiconductor device tester of the type that has: 1) A tester-check mode for analyzing correct operation and functional stability of the tester by reference to characteristic data of a pre-tested standard semiconductor device; and, 2) a standard-device-creation mode for creating a new standard device for use with the tester, the method comprising:

reading a mode of operation selected by a test engineer; and, if in the standard-device-creation mode, then:

reading the type number and serial number of a candidate standard device loaded in the tester;

determining whether a standard device having identical type and serial numbers is available, and if such standard device is available, determining whether to replace such standard device; and, if such standard device is not available, or if it is determined to replace such standard device, then:

repeatedly testing the candidate device a predefined number of times to measure during each test a predefined set of test items comprising electrical characteristics of the candidate device;

calculating the mean values and standard deviations of every test item in the sets; and, determining whether the candidate device is suitable for use as a standard device, based on whether the calculated values and standard deviations are within predetermined distribution ranges; and, if in the tester-check mode, then:

reading the type number and serial number of a standard device loaded in the tester;

fetching reference data comprising a set of previously measured electrical characteristics of the standard device;

repeatedly testing the standard device with the tester a predefined number of times to measure during each test a set of electrical characteristics of the standard device corresponding to the previously measured electrical characteristics of the standard device fetched;

calculating a mean value X of every electrical characteristic measured in the sets;

comparing the test data with the reference data to determine whether the tester is functionally stable; and, if the calculated data is outside of a predetermined range; checking the tester.

2. The method of claim 1, wherein the tester includes a test instrument, a test option, and a test option check program, and is determined to be malfunctioning, and wherein checking the tester further comprises:

retrieving previously-stored information relating to both the standard device and the tester;

comparing the information relating to the standard device with the information relating to the tester;

re-calibrating the test instrument of the tester in accordance with the comparing of the information relating to the standard device and the tester;

re-testing the standard device with the re-calibrated tester to determine whether the re-calibrated tester is functioning properly; and, if the re-calibrated tester is determined to be still malfunctional;

running the test-option check program; and, outputting the results of the test-option check program.

3. The method of claim 1, wherein, in the standard-device-creation mode, the candidate standard device is tested 30 times.

4. The method of claim 1, wherein, in the tester-check mode, the standard device is tested 30 times.

5. The method of claim 1, wherein, in the standard-device-creation mode, determining whether the candidate device is suitable for use as a standard device comprises:

calculating from the repeated tests of the candidate device a mean value, a standard deviation and a distribution index of each of the electrical characteristics of the candidate device in the set, wherein the distribution index is defined as (mean value−lower limit)/(upper limit−lower limit)/2, wherein the upper limit and the lower limit are respectively the highest and lowest allowable values within a predefined specification for each of the electrical characteristics of the device; and, determining whether the distribution index calculated for the candidate device is within the range of from between 0.8413 and 1.1587.

6. The method of claim 1, wherein, in the tester-check mode, the reference data fetched include a mean value m and a standard deviation σ' of each of the electrical characteristics of the standard device, and wherein comparing the test data with the reference data to determine whether the tester is functionally stable comprises:

determining whether X is within the range of from (m−0.1587σ') to (m+0.1587σ').

7. A method for verifying the correct operation of a tester for semiconductor devices, comprising:

loading a standard device into the tester;

identifying the standard device to the tester by entering the type number and serial number of the standard device;

fetching reference data comprising a set of previously measured electrical characteristics of the standard device, the reference data including a mean value m and a standard deviation value σ' of each measured characteristic of the standard device;

repeatedly testing the standard device with the tester a predefined number of times to measure during each test a set of electrical characteristics of the standard device corresponding to the previously measured electrical characteristics of the standard device;

generating test data from the measured electrical characteristics of the standard device resulting from the repeated testing of the standard device, including calculating a mean value X of each measured electrical characteristic;

comparing the test data to the reference data; and, determining whether the tester is functioning correctly, based on the comparing of the test data and the reference data.

8. The method of claim 7, wherein determining whether the tester is functioning correctly comprises:

computing from the reference data an allowable range of variation of the mean value X of each measured electrical characteristic of the standard device; and, determining whether the mean value X of each measured electrical characteristic of the standard device tested falls within the allowable range.

9. The method of claim 8, wherein the allowable range of X computed from the reference data is from (m−0.1587σ') to (m+0.1587σ').

10. The method of claim 7, wherein the tester is determined to be malfunctioning and includes a test instrument, a test option, and a test-option check program, and further comprising:

retrieving previously-stored information relating to both the standard device and the tester;

comparing the information relating to the standard device with the information relating to the tester; and, re-calibrating the test instrument of the tester in accordance with the comparing of the information relating to the standard device and the tester.

11. The method of claim 10, further comprising running the test-option check program to check the test option of the tester.

12. The method of claim 11, wherein the testing of the standard device is repeated 30 times.

13. A method for creating a standard device for use by a tester for semiconductor devices comprising:

loading a candidate standard device into the tester;

identifying the candidate device to the tester by entering a type number and a serial number of the candidate device;

repeatedly testing the candidate device with the tester a predefined number of times to measure during each test a predefined set of electrical characteristics of the standard device;

calculating from the repeated tests of the candidate device a mean value, a standard deviation and a distribution index of each of the electrical characteristics of the candidate device in the set, wherein the distribution index is defined as (mean value−lower limit)/(upper limit−lower limit)/2, wherein the upper limit and the lower limit are respectively the highest and lowest allowable values within a predefined specification for each of the electrical characteristics of the device; and, determining whether the distribution index calculated for the candidate device is within the allowable range.

14. The method of claim 13, further comprising:

reading the entered type number and serial number of the candidate device;

determining whether another standard device having the same type and serial number exists; and, determining whether or not to replace the standard device with the candidate device.

15. The method of claim 13, wherein testing of the candidate device is repeated 30 times.

16. The method of claim 15, wherein the allowable range for the distribution index is from 0.8413 to 1.1587.

* * * * *